United States Patent
Nagae et al.

(10) Patent No.: US 8,826,856 B2
(45) Date of Patent: *Sep. 9, 2014

(54) OPTICAL THIN-FILM VAPOR DEPOSITION APPARATUS AND OPTICAL THIN-FILM PRODUCTION METHOD

(75) Inventors: Ekishu Nagae, Kanagawa (JP); Yousong Jiang, Kanagawa (JP); Ichiro Shiono, Kanagawa (JP); Tadayuki Shimizu, Kanagawa (JP); Tatsuya Hayashi, Kanagawa (JP); Makoto Furukawa, Kanagawa (JP); Takanori Murata, Kanagawa (JP)

(73) Assignee: Shincron Co., Ltd., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/058,557

(22) PCT Filed: Aug. 17, 2009

(86) PCT No.: PCT/JP2009/064403
§ 371 (c)(1),
(2), (4) Date: Feb. 11, 2011

(87) PCT Pub. No.: WO2010/018876
PCT Pub. Date: Feb. 18, 2010

(65) Prior Publication Data
US 2011/0151135 A1    Jun. 23, 2011

(30) Foreign Application Priority Data

Aug. 15, 2008 (WO) .................. PCT/JP2008/064647

(51) Int. Cl.
*C23C 16/00* (2006.01)
*C23C 16/50* (2006.01)
*C23C 14/22* (2006.01)
*C23C 14/10* (2006.01)
*C23C 14/08* (2006.01)

(52) U.S. Cl.
CPC ............... *C23C 14/22* (2013.01); *C23C 14/225* (2013.01); *C23C 14/221* (2013.01); *C23C 14/10* (2013.01); *H01J 2237/3132* (2013.01); *C23C 14/083* (2013.01); *H01J 2237/0041* (2013.01)
USPC .......... 118/723 MP; 118/723 EB; 118/723 R; 118/726; 118/728

(58) Field of Classification Search
USPC ................. 118/720, 726–727, 723 R, 723 FI; 204/192.1, 298.01
See application file for complete search history.

(56) References Cited

U.S. PATENT DOCUMENTS

| | | | | |
|---|---|---|---|---|
| 3,705,320 A * | 12/1972 | Freeman | | 313/363.1 |
| 3,858,547 A * | 1/1975 | Bergfelt | | 118/730 |
| 4,380,212 A * | 4/1983 | Kraus | | 118/720 |
| 4,449,478 A * | 5/1984 | Kraus | | 118/720 |
| 5,009,923 A * | 4/1991 | Ogata et al. | | 427/533 |
| 6,153,061 A * | 11/2000 | Tzeng et al. | | 204/192.16 |
| 6,171,462 B1 * | 1/2001 | Gries et al. | | 204/298.15 |
| 6,214,772 B1 * | 4/2001 | Iijima et al. | | 505/475 |
| 6,236,163 B1 | 5/2001 | Maishev et al. | | |
| 6,777,699 B1 * | 8/2004 | Miley et al. | | 250/492.3 |
| 6,899,928 B1 * | 5/2005 | Groves et al. | | 427/529 |
| 7,311,939 B2 * | 12/2007 | Zultzke et al. | | 427/164 |
| 7,531,205 B2 * | 5/2009 | Selvamanickam et al. | | 427/62 |
| 2003/0234371 A1 | 12/2003 | Ziegler | | |
| 2005/0239659 A1 | 10/2005 | Xiong et al. | | |
| 2011/0262656 A1 * | 10/2011 | Nagae et al. | | 427/535 |

FOREIGN PATENT DOCUMENTS

| | | | | |
|---|---|---|---|---|
| JP | 2000-129421 | | | 5/2000 |
| JP | 2004-53720 | | | 2/2004 |
| JP | 2004-131783 | | | 4/2004 |
| JP | 2004131783 | A | * | 4/2004 |
| JP | 2006-045632 | | | 2/2006 |
| JP | 2006-091600 | | | 4/2006 |
| JP | 2006091600 | A | * | 4/2006 |
| JP | 2007-248828 | | | 9/2007 |
| JP | 2007-270336 | | | 10/2007 |
| WO | 2006068355 | A1 | | 6/2006 |

OTHER PUBLICATIONS

Toyosaki, Koichi, Apr. 30, 2004, Translation of JP2004131783.*
So, Matashiyu, Feb. 16, 2006, Translation of JP20066045632.*
Takahara, Hiroshige, Apr. 6, 2006, Translation of JP2006091600.*
Supplementary European Search Report, Date of completion of the search Jun. 28, 2011, Application No. EP 09 80 6764.
Non-Final Office Action dated Apr. 18, 2014 to Ekishu Nagae from U.S. Appl. No. 13/179,004, filed Jul. 8, 2011.

* cited by examiner

*Primary Examiner* — Gordon R Baldwin
*Assistant Examiner* — Charlee Bennett
(74) *Attorney, Agent, or Firm* — Novak Druce Connolly Bove + Quigg LLP (57) ABSTRACT

An optical thin-film vapor deposition apparatus and method are capable of producing an optical thin-film by vapor depositing a vapor deposition substance onto substrates (14) within a vacuum vessel (10). A dome shaped holder (12) is disposed within the vacuum vessel (10) and holds the substrates (14). A drive rotates the dome shaped holder (12). A vapor depositing source (34) is disposed oppositely to the substrates (14). An ion source (38) irradiates ions to the substrates (14). A neutralizer (40) irradiates electrons to the substrates (14). The ion source (38) is disposed at an angle between an axis, along which ions are irradiated from the ion source (38), and a line perpendicular to a surface of each of the substrates (14). The angle is between 8° inclusive and 40° inclusive. A ratio of a distance in a vertical direction between (i) a center of rotational axis of the dome shaped holder (12), and (ii) a center of the ion source (38), relative to a diameter of the dome shaped holder (12), is between 0.5 inclusive and 1.2 inclusive.

14 Claims, 7 Drawing Sheets

OPTICAL THIN-FILM VAPOR DEPOSITION APPARATUS AND OPTICAL THIN-FILM PRODUCTION METHOD

TECHNICAL FIELD

The present application describes an optical thin-film vapor deposition apparatus and an optical thin-film production method, and particularly an optical thin-film vapor deposition apparatus comprising an ion source for irradiating ions onto a substance body, and an optical thin-film production method.

BACKGROUND ART

Vapor deposition apparatuses, i.e., ion-assisted vapor deposition apparatuses, have been conventionally known, each configured to irradiate ions onto a vapor deposition layer deposited on a substrate by vaporizing a thin-film material toward a surface of the substrate within a vacuum vessel, thereby densifying the vapor deposition layer. In each of such vapor deposition apparatuses, an ion beam(s) (gas ions) of relatively low energy is/are irradiated onto a substance body (or substance bodies) by an ion source(s), and neutralizing electrons (electrons) are irradiated onto the substance body (or substance bodies) by a neutralizing device called a neutralizer. This configuration enables the fabrication of a dense optical thin-film by virtue of a kinetic energy of the ion beam, while neutralizing an electric charge accumulated on the substrate(s) by the ion beam (see Patent Document 1, for example).

Figure 7:
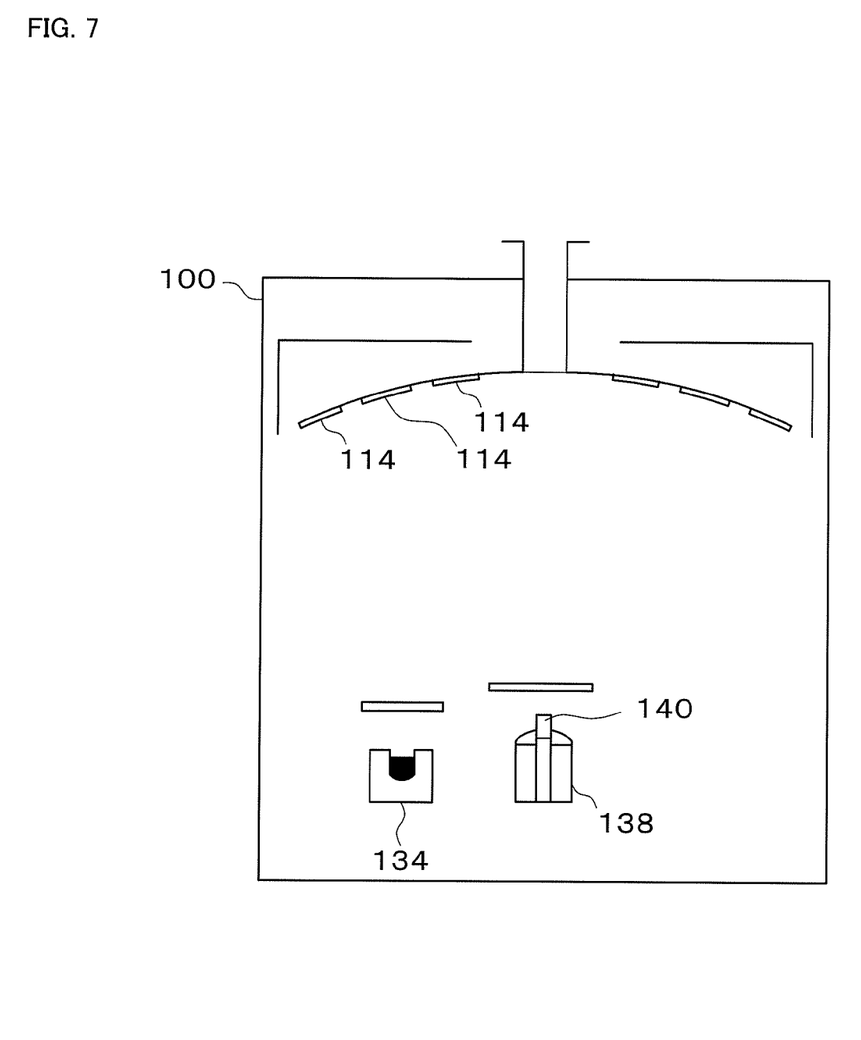
FIG. 7 is a schematic cross-sectional view of a conventional optical thin-film vapor deposition apparatus.

According to a technique described in the Patent Document 1, and as shown in FIG. 7 of the present application, an optical thin-film comprising a multi-layer film is obtained by alternately vaporizing a high refractive index substance and a low refractive index substance from a vapor deposition source 134 and alternately stacking them. Upon formation of films of the high refractive index substance and low refractive index substance, the substances once vaporized and attached onto substrates 114 are densified by argon ions and oxygen ions irradiated from an ion source 138, and charging of the substrates 114, a substrate holder, and the like is prevented by virtue of neutralizing electrons irradiated from a neutralizer 140.

Disclosed in the technique shown in the Patent Document 1 is a vapor deposition apparatus having a configuration where the vapor deposition source 134 and the ion source 138 are arranged at positions opposed to the substrates 114, i.e., at a bottom surface side of a vacuum vessel. In this apparatus, the distance between the vapor deposition source 134 and the substrate holder (substrates 114) is required to be kept at a constant ratio relative to a size of the substrate holder, so as to keep a film thickness distribution constant. As such, in case that the vapor deposition source 134 is arranged at an appropriate distance from substrates 114 in a vapor deposition apparatus provided with a substrate holder having a greater diameter, the apparatus is brought into an arrangement where the substrate holder is undesirably distanced from the ion source 138, thereby possibly deteriorating the effect of ion assistance.

To solve such a problem, techniques have been proposed (see Patent Documents 2 to 4), each configured to enhance an ion assistance effect by mounting an ion source at a side surface position of a vacuum vessel which position is closer to a substrate holder than a vapor deposition source, thereby avoiding deterioration of film-formation efficiency.

Patent Document 1: Japanese Patent Laid-Open No. 2007-248828A
Patent Document 2: Japanese Patent Laid-Open No. 2000-129421A
Patent Document 3: Japanese Patent Laid-Open No. 2004-131783A
Patent Document 4: Japanese Patent Laid-Open No. 2006-045632A According to the techniques disclosed in the Patent Documents 2 to 4, the ion source is mounted at a position closer to the substrate holder than the vapor deposition source, or at a position which is closer to the substrate holder than the vapor deposition source and which is near a side surface of the vacuum vessel, thereby preventing deterioration of an effect of ion assistance, and deterioration of a film-formation efficiency by ion plating, to a certain extent. More specifically, according to the techniques described in the Patent Documents 2 to 4, ion beams irradiated from ion sources can be irradiated onto substrates while keeping higher energy states of the ion beams. However, it has been desired to obtain a higher effect of ion assistance.

Meanwhile, examples of optical thin-films to be obtained by combining a high refractive index substance with a low refractive index substance include a cut filter for cutting off a light at a particular wavelength and for transmitting light at wavelengths other than the particular wavelength through the filter. In case of optical thin-films like the cut filter, those films, which have less loss of transmitted light and less white cloudiness, are regarded as more excellent ones, respectively, and a value (%) of a sum of a reflectance and a transmission is adopted as an index of quality of such a film. Further, it is typically assumed that thin films having such a value closer to 100% are more excellent optical thin-films. It has been thus desired to obtain an apparatus for forming an optical thin-film, having a value of a sum of a reflectance and a transmission which is closer to 100%, while maintaining a higher film-formation efficiency as mentioned above.

However, in case of the technique disclosed in the Patent Document 2, the substrate holder is made planar, so that the ion assistance effect to be obtained by the ion source provided at a lateral side of the vacuum vessel is not likely to be kept constant relative to substrates, thereby causing a problem that a film-quality of an optical thin-film to be resultingly obtained is not likely to be kept homogeneous. In turn, although the substrate holders of the Patent Documents 3 and 4 are dome-shaped, no disclosures are found therein about positional relationships between the ion source(s) and the substrate holder, such as an angle of ion beams to be irradiated from the ion sources onto placed substrates. Thus, although the ion assistance effect may be obtained by the techniques disclosed in the Patent Documents 3 and 4, the extent of ion assistance effect related to a mounting position of the ion source(s) is not shown in these documents. It has been thus difficult in the conventional techniques to obtain an optical thin-film having superior optical characteristics with a homogeneous film-quality, while obtaining a higher ion assistance effect.

It is therefore desired to provide an optical thin-film vapor deposition apparatus comprising an ion source, which apparatus allows for obtaining a higher ion assistance effect and obtaining an optical thin-film having a homogeneous film-quality and excellent optical characteristics. It is also desired to provide: an optical thin-film vapor deposition apparatus capable of producing a high-performance optical thin-film while achieving reduction of a production cost of the optical thin-film; and a production method of an optical thin-film having a higher performance with a lower production cost.

Means for Solving Problem

The present inventors have earnestly and repetitively conducted investigations to solve the above problem, and have obtained such a new knowledge that an ion irradiation effect higher than conventional is obtainable, by conducting a film-forming treatment in a manner to cause ions to be incident on a substance body surface, at a predetermined angle between an axis, along which ions are irradiated, and a line perpendicular to the substance body surface.

One embodiment of a solution to the problem is an optical thin-film vapor deposition apparatus for vapor depositing a vapor deposition substance onto substrates within a vacuum vessel, comprising: a dome shaped holder disposed within the vacuum vessel and configured to hold the substrates; a drive configured to rotate the dome shaped holder; a vapor deposition source disposed oppositely to the substrates; an ion source configured to irradiate ions to the substrates; and a neutralizer configured to irradiate electrons to the substrates; wherein the ion source is disposed at a position such that a maximum angle defined between an axis, along which ions are irradiated from the ion source, and a line perpendicular to a surface of each of the substrates held by the dome shaped holder, is between 8° inclusive and 40° inclusive; and such that a ratio of a distance in a vertical direction between (i) an intersection between a center of rotational axis of the dome shaped holder and the dome shaped holder itself, and (ii) a center of the ion source, relative to a diameter of the dome shaped holder, is within a range between 0.5 inclusive and 1.2 inclusive.

In this way, in the vapor deposition apparatus, which comprises: the dome shaped holder configured to hold the substrates within the vacuum vessel; the drive configured to rotate the dome shaped holder; the vapor depositing source disposed oppositely to the substrates; the ion source configured to irradiate to the substrates; and the neutralizer configured to irradiate electrons to the substance bodies; wherein a high refractive index substance and a low refractive index substance are alternately vapor deposited to form optical thin-films; the ion source is mounted so that the axis, along which ions are irradiated from the ion source, has a predetermined angle relative to the axis around which the dome shaped holder rotates.

Further, the apparatus is designed such that the maximum angle to be formed by the axis along which ions are irradiated from the ion source, relative to the line perpendicular to the surface of each of the substrates is between 8° inclusive and 40° inclusive, thereby enabling exertion of a stress in a shearing direction to a surface of each of the substrates, as compared to a conventional optical thin-film vapor deposition apparatus where an ion beam is collided with a substance body at an angle approximately close to a right angle. Namely, the energy to be provided to the vapor deposition substance is increased, and the migration of the vapor deposition substance deposited on the surface of each substrate in a manner to smooth the surface of the vapor deposition substance, to densify it, and to homogenize the thin-film structure, is high. Thus, an optical thin-film is formed having a homogeneous film-quality with a lower electric-power or in a shorter time, and improved film-quality is realized.

Furthermore, when the maximum angle to be formed by the axis of the ion beam relative to the line perpendicular to the surface of each of the substrates is between 8° inclusive and 40° inclusive, irradiated ions are never obstructed by the dome shaped holder, so that a thin-film formed on each substrate is made homogeneous, thereby obtaining an optical thin-film of excellent film-quality.

To the contrary, in case of angles other than the above-mentioned angle, i.e., in case where the maximum angle to be formed by the axis of the ion beam relative to the line perpendicular to the surface of each of the substrates is larger than 40°, for example, the ion beam is obstructed by the dome shaped holder particularly when the dome shaped holder is curved, so that the film-quality of the obtained optical thin-film is made inhomogeneous on each substrate. In turn, in case that the maximum angle to be formed by the axis of the ion beam relative to the line perpendicular to the surface of each of the substrates is smaller than 8°, the distance between the ion source and each of the substrates is increased to disadvantageously decrease the ion assistance effect.

Moreover, the mounting position of the ion source is so arranged that a ratio of a distance in a vertical direction between (i) an intersection between a center of rotational axis of the dome shaped holder and the dome shaped holder itself, and (ii) a center of the ion source, relative to a diameter of the dome shaped holder, is 0.5 to 1.2, resulting in that the ion beam is apt to be uniformly irradiated onto the substrates, without being obstructed by the dome shaped holder. This result enables formation of an optical thin-film having excellent optical characteristics, with a higher ion assistance effect.

Thus, when the maximum angle to be formed by the axis of the ion beam relative to the line perpendicular to the surface of each of the substrates is between 8° inclusive and 40° inclusive, it is possible to achieve a vapor deposition apparatus capable of forming an optical thin-film having excellent film-quality even in case of adopting substrates (lens-shaped substrates such as concave lenses, for example) each having a concavity and/or convexity thereon because the ion beam is never obstructed by a part of each substrate.

In another embodiment, it is preferable that the ion source is disposed on a side surface of the vacuum vessel. In this way, by disposing the ion source on the side surface of the vacuum vessel, it is enabled to dispose the ion source near the substrates, and to readily keep the incidence angle of the ion beam on each substrate at a desired degree. This configuration allows an increase in the incidence angle of the ion beam and an increase in the energy to be provided to the vapor deposition substance, thereby enabling further enhancement of the effects to clean up the vapor deposition substance deposited on the surface of each substrate, to smooth the surface of the vapor deposition substance, and to densify the thin-film structure. Namely, the above configuration allows the ion beam in a higher energy state to be collided with a surface of each substrate at an appropriate incidence angle, so that the thin-film to be formed on the substrate surface is densified and the compositional homogeneity thereof is improved. Further, when the predetermined ion beam incidence angle is set by disposing the ion source on the side surface of the vacuum vessel in this way, a reduction of stress distortion of each substrate is achieved. This resultingly enables achievement of an optical thin-film vapor deposition apparatus capable of producing an optical device, which varies less in refractive index (high in homogeneity) and which has a small optical-absorption coefficient.

However, even when the ion source is provided on the side surface of the vacuum vessel at this time, if the maximum angle to be formed by the axis of the ion beam relative to the line perpendicular to the surface of each substrate is out of the above angle range, and particularly larger than 40°, the ion source is obliged to be constitutionally disposed near the substrates as vapor deposition targets, so that the ion source is exposed to a sputtered vapor deposition substance and is apt to be contaminated thereby. It is thus required then to frequently conduct maintenance of the ion source. Nonetheless, the ion source is disposed at an appropriate distance from the substrates by adopting the above-mentioned angle range (between 8° inclusive and 40° inclusive) in the optical thin-film vapor deposition apparatus, so that contamination due to vapor deposition substance is not likely to be attached to the ion source, thereby simplifying the maintenance of the apparatus.

Further, in still another embodiment, it is preferable at this time that the ion source is disposed so that a distance between the ion source and an applicable one of the substrates is equal to or shorter than a mean free path of ions to be irradiated from the ion source. In this way, the ion source is disposed so that the distance between the ion source and the applicable one of the substrates is equal to or shorter than the mean free path of ions to be irradiated from the ion source, resulting in that most of the ions emitted from the ion source are allowed to arrive at the substrates in a collisionless state of the ions even in case of a vapor deposition apparatus provided with a substrate holder having a larger diameter, thereby enabling irradiation of an ion beam having a higher kinetic energy onto the substrates. Further, mounting the ion source at the above-mentioned position increases the effect of ion assistance, and enables film formation with a lower electric-power or in a shorter time. This further achieves a vapor deposition apparatus capable of improving the film-quality of an optical thin-film.

In yet another embodiment, it is further preferable that the ion source comprises: an ion source body that irradiates for irradiating the ions; a connecting portion that connects the ion source body to the vacuum vessel; and a vacuum-inward introducing portion that introduces at least a source gas of the ions into the vacuum vessel; and that the angle, at which the ions are irradiated, relative to the line perpendicular to the surface of each of the substrates, is adjustable by modifying the connecting portion. In this way, the ion source comprises the connecting portion provided between the vacuum vessel and the ion source body so that the mounting angle of the ion source can be arbitrarily adjusted by appropriately modifying the connecting portion. Further, the ion source is mounted on the side surface of the vacuum vessel through the connecting portion, thereby enabling adjustment of the ion source in a manner to restrict the loss of an ion beam to a minimal extent, and to uniformly distribute the ion current density over an applicable film formation region. This enables ready control of the ion current density distribution to uniformalize it, so that the obtained optical thin-film is uniformly formed with a vapor deposition substance, thereby enabling achievement of a vapor deposition apparatus for forming an optical thin-film having excellent film-quality.

In still yet another embodiment, it is preferable that the connecting portion is configured to include a bracket fixed to the vacuum vessel side, and a locking member for fixing the inclination of the ion source at a predetermined angle. This configuration allows an operator to readily modify the ion irradiating angle by simply and appropriately modifying the locking member, thereby enabling achievement of an optical thin-film vapor deposition apparatus having excellent operability.

Further, in another embodiment, it is preferable to dispose the neutralizer at a position separated from the ion source by a predetermined distance. In this way, the neutralizer is disposed at a position separated from the ion source by a predetermined distance, thereby enabling an optical thin-film vapor deposition apparatus to be capable of efficient film formation without losing ions irradiated from the ion source and electrons irradiated from the neutralizer.

In yet another embodiment, it is preferable that the ion source comprises multiple ion sources provided along a rotating direction of the substrate holder. In this way, the dome shaped holder is configured to be rotatable and the ion source comprises the multiple ion sources provided along the rotating direction of the dome shaped holder, thereby enabling ready distribution adjustment of ion beams to be irradiated to the substrates, and particularly enabling ready adjustment of a density distribution of ion beams to be irradiated to substrates in a large-sized vapor deposition apparatus.

Meanwhile, another embodiment is an optical thin-film production method comprising the step of using the optical thin-film vapor deposition apparatus according to any one of the embodiments described above to conduct fabrication. In this way, it is possible to produce an optical thin-film having a uniform film thickness and excellent optical characteristics.

Effect

According to the optical thin-film vapor deposition apparatus of the first embodiment described above, the energy to be provided to the vapor deposition substance is increased, and deposition of the vapor deposition substance on the surface of each substrate in a manner to smooth the surface of the vapor deposition substance, to densify it, and to homogenize the thin-film structure, is enhanced thereby enabling effective improvement in film-quality.

According to the optical thin-film vapor deposition apparatus of the second embodiment described above, the incidence angle of the ion beam relative to each substrate is appropriately maintained, and the homogeneity of a thin-film structure formed on the substrate is effectively improved.

According to the optical thin-film vapor deposition apparatus of the third embodiment described above, the ion beam in a higher energy state may be caused to collide with a surface of each substrate, in a manner to enhance the effect of ion assistance and to conduct film formation with a lower electric-power or in a shorter time, thereby enabling effective improvement in film-quality.

According to the optical thin-film vapor deposition apparatus of the fourth embodiment described above, the ion source can be adjusted in a manner to restrict a loss of an ion beam to a minimal extent, and to uniformly distribute the ion current density over an applicable film formation region.

According to the optical thin-film vapor deposition apparatus of the fifth embodiment described above, the ion irradiating angle can be readily modified.

According to the optical thin-film vapor deposition apparatus of the sixth embodiment described above, film formation can be efficiently conducted without losing ions irradiated from the ion source and electrons irradiated from the neutralizer.

According to the optical thin-film vapor deposition apparatus of the seventh embodiment described above, the distribution of ion beams to be irradiated to substrates can be readily adjusted.

According to the optical thin-film production method of the eighth embodiment described above, an optical thin-film can be produced having excellent characteristics even with a relatively lower production cost.

EXPLANATIONS OF LETTERS OR NUMERALS

| | |
|---|---|
| 1: | optical thin-film vapor deposition apparatus |
| 10, 100: | vacuum vessel |
| 12: | substrate holder (substance-body holding means) |
| 14, 114: | substrate (substance body) |
| 34, 134: | vapor deposition source |
| 34a, 38a: | shutter |
| 38, 138: | ion source |
| 40, 140: | neutralizer |
| 44: | attachment (connecting portion) |
| θ: | mounting angle (ion-beam incidence angle) |
| H: | height of center of substrate holder from ion source |
| h: | mounting height |
| D: | diameter of substrate holder |
| d: | distance from ion source to center of substrate holder |
| T: | transmission |
| R: | reflectance |
| λ: | wavelength |
| l: | mean free path |

BEST MODE(S)

Embodiments of the present invention will be described hereinafter with reference to the drawings. It is noted that the members, arrangements, and the like to be described hereinafter are mere examples without restricting the present invention thereto, and can be of course variously modified without departing from the spirit or scope of the present invention.

Figure 1:
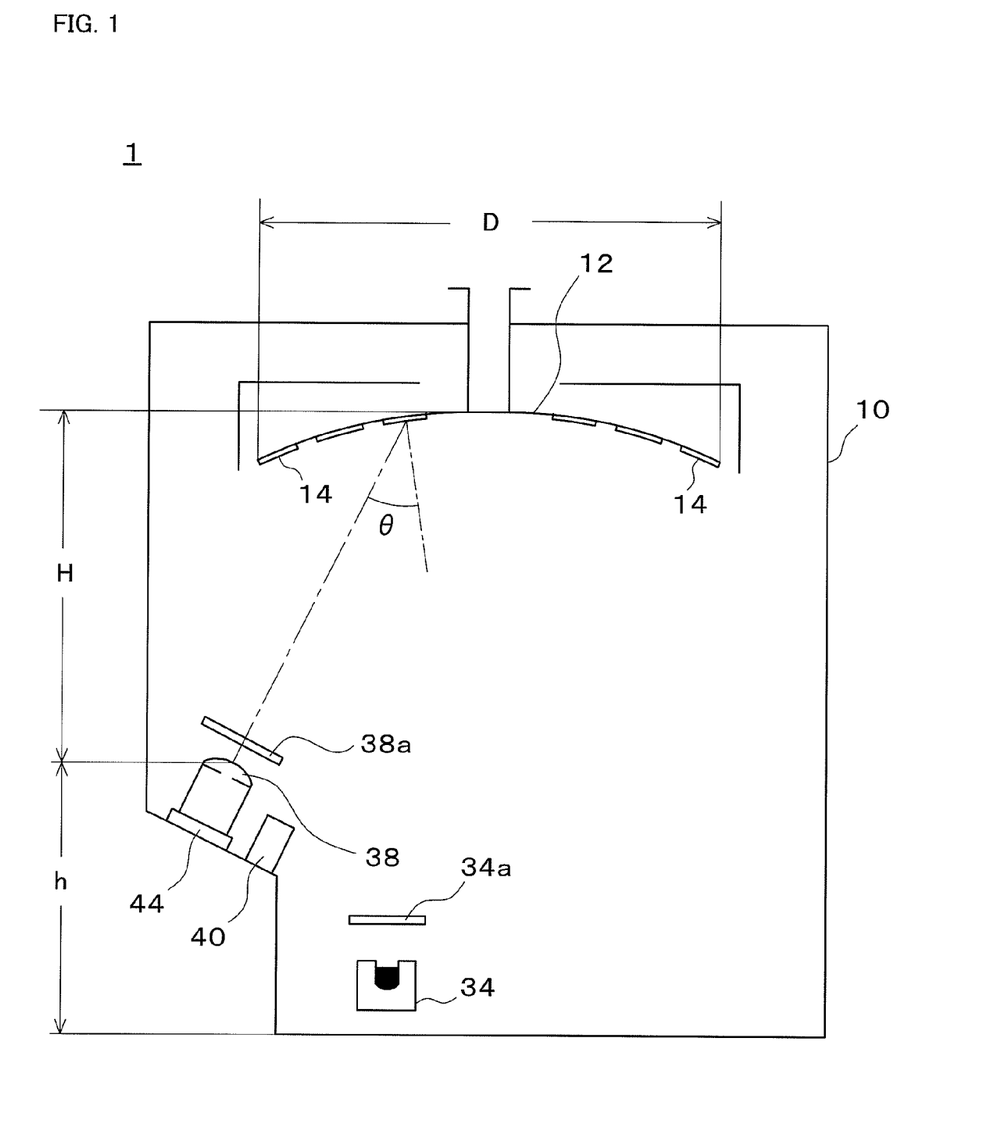
FIG. 1 is a schematic cross-sectional view of an optical thin-film vapor deposition apparatus.

FIG. 1 is a schematic cross-sectional view of an optical thin-film vapor deposition apparatus 1 as an embodiment of the present invention. The optical thin-film vapor deposition apparatus 1 is an ion-assisted vapor deposition apparatus capable of a film-forming treatment while irradiating an ion beam (gas ions) onto substrates from an ion source 38, and comprises a vertically disposed cylindrical vacuum vessel 10, and a substrate holder 12 held at an upper position of the interior of the vessel. Disposed at a lower position of the interior of the vacuum vessel 10 is a vapor deposition source 34. Further, disposed on an inner side surface of the vacuum vessel 10 are the ion source 38 and a neutralizer 40. The interior of the vacuum vessel 10 is evacuated by an evacuating means (not shown) down to a predetermined pressure (such as in the order of $3 \times 10^{-2}$ to $10^{-4}$ Pa).

The substrate holder 12 is a member made of stainless steel formed into a dome shape to be held within the vacuum vessel 10 at an upper side thereof so as to be rotatable about a vertical axis, and is coupled to an output shaft of a motor (not shown). The substrate holder 12 has a lower surface which supports multiple substrates 14 having downwardly directed film-forming faces, respectively.

Each substrate 14 is a member having a light transmissivity such as a resin (polyimide, for example) or quartz, onto a surface of which a dielectric film or an absorption film is to be attached by film formation. Although the substrates 14 may have disk-like shapes, respectively, the shape thereof is not limited thereto, and other shapes such as a lens shape, cylindrical shape, toroidal shape, and the like are usable insofar as a thin film can be formed on a surface thereof.

The vacuum vessel 10 is a vessel made of stainless steel in a substantially cylindrical shape to be typically adopted in a known film-forming apparatus, and is kept at an earth potential. The vacuum vessel 10 is provided with an evacuating port (not shown), and is connected to a vacuum pump (not shown) through the evacuating port. Further, the vacuum vessel 10 is formed with a gas introducing pipe (not shown) for introducing a gas into the vacuum vessel.

The vapor deposition source 34 is provided within the vacuum vessel 10 at a lower side thereof, and acts as vaporizing means configured to heat a high refractive index substance, a low refractive index substance, and the like by an electron beam heating method, and to emit the heated substance toward the substrates 14. Mounted above the vapor deposition source 34 is a shutter 34a operable to be opened and closed. The shutter 34a is appropriately controlled to be opened and closed by a controller (not shown).

Optical filters, films of which may be formed in this embodiment, are formed as films by alternately stacking a high refractive index substance and a low refractive index substance. However, the present invention is also applicable to formation of an optical filter film, which film is made of one kind or multiple kinds of vaporizing substances, and in that case, it is possible to appropriately change the number of vapor deposition sources, the arrangement thereof, and the like. Although a short wavelength pass filter (SWPF) and an infrared cut filter are mentioned hereinafter as specific examples of an optical filter to be fabricated in this embodiment, the present invention is additionally applicable to other thin-film devices such as a long wavelength pass filter, band-pass filter, ND filter, and the like.

The ion source 38 comprises: an ion source body for irradiating ions therefrom; a connecting portion (attachment 44) for installing the ion source body on the vacuum vessel 10; and a vacuum-inward introducing portion (flange (not shown)) for introducing at least a gas, as a source material of ions to be irradiated, into the interior of the vacuum vessel 10. The vacuum-inward introducing portion also has a function as a feed-through portion for introduction of electricity, and cold water, in addition to the gas. The ion source 38 is configured to emit an ion beam toward substrates 14, in an exemplary manner to extract charged ions ($O_2^+$, $Ar^+$) from a plasma of a reaction gas (such as $O_2$) or rare gas (such as Ar), to accelerate the ions by an acceleration voltage, and to emit them. Further, mounted above the ion source 38 is a shutter 38a which is appropriately controllable to be opened and closed by a controller (not shown).

The neutralizer 40 is configured to emit electrons ($e^-$) toward substrates 14, in a manner to extract electrons from a plasma of a rare gas such as Ar, to accelerate the electrons by an acceleration voltage, and to emit them. Those ions attached to the surfaces of the substrates 14 are neutralized by the electrons emitted from the neutralizer, respectively. In the optical thin-film vapor deposition apparatus 1 according to this embodiment, the neutralizer 40 is disposed at a predetermined distance from the ion source 38. The mounting position of the neutralizer 40 is arbitrary, as long as the neutralizer 40 is capable of irradiating electrons onto the substrates 14 to neutralize them.

Next, the mounting manner and position of the ion source 38 will be explained. The ion source 38 is mounted on a side surface of the vacuum vessel 10, through the attachment 44 as the connecting portion. Since the ion source 38 is mounted on the side surface of the vacuum vessel 10, the ion beam to be irradiated from the ion source 38 arrives at the substrates 14 with short flying distances, respectively, thereby restricting the lowering of the kinetic energies of the ions upon collision thereof with the substrates 14. Although the ion source 38 is disposed on the side surface of the vacuum vessel 10 in this embodiment, the ion source may be provided at a position on a bottom surface of the vacuum vessel insofar as the position meets a mounting angle $\theta$ and a mounting height h to be described below.

Here, the ion source 38 is mounted on the side surface of the vacuum vessel 10, so that the ion beam is caused to be incident on the substrates 14 at angles, respectively. It has been recognized that possession of such angles by the ion beam to be incident on the substrates 14 is accompanied by a remarkable advantage. Namely, it has been found out that the ion beam in a state of high kinetic energy is collided with surfaces of substrates 14 from directions oblique thereto, respectively, to obtain a higher effect of ion assistance than is conventional. An ion beam at this oblique angle is capable of causing a greater energy to be acted on a vapor deposition substance(s) deposited on surfaces of the substrates 14, as described below.

It is noted that the ion source 38 is arranged in this embodiment at a position that is closer to the substrates 14 than the position of the vapor deposition source 34, by a distance equal to or longer than a length of the body of the ion source 38 itself. Further, although a part of the side surface of the vacuum vessel 10 is formed inclinedly so as to facilitate installation of the ion source 38, the position where the ion source 38 is to be mounted is arbitrary. It is noted that the "length of the body of the ion source 38" means a distance from an electrode of the ion source 38 (ion gun) to the side surface (sidewall) of the vacuum vessel 10 where the ion source 38 is installed.

The attachment 44 is mounted at the connecting portion of the ion source 38, i.e., at the side surface of the vacuum vessel 10. It is noted that although the ion source 38 is installed at the sidewall of the vacuum vessel 10 in this embodiment, the ion source 38 may be installed at the bottom surface of the latter, and in that case, the attachment 44 is also disposed at the bottom surface of the vacuum vessel 10. The attachment 44 comprises, as main constituent elements: a bracket (not shown) fixed at the vacuum vessel 10 side; a pin (not shown) for inclinably supporting the ion source body (not shown) side of the ion source 38 to the bracket side; and a locking member (not shown) comprising a screw for fixing the inclination of the ion source 38 at a predetermined position. Thus, the mounting angle of the ion source 38 is arbitrarily adjustable. Further, the ion source may be adjustably configured not only in the mounting angle, but also in the height direction and in a radial direction of the vacuum vessel 10, by providing the bracket at the vacuum vessel 10 side, and by fixing the bracket to a base plate (not shown) which is positionally adjustable. It is noted that such a base plate is capable of adjusting the ion source 38 to an appropriate position by fixing the bracket against the base plate. The adjustment of the positions of the ion source 38 in the height direction and in the radial direction of the vacuum vessel 10 is conducted by moving the base plate in the up-and-down direction and the radial direction of the vacuum vessel 10.

Changing the mounting height h of the ion source 38 (hereinafter simply called "mounting height h") and the position thereof in the radial direction of the vacuum vessel 10 enables adjustment of the ion source 38 at an appropriate distance from substrates 14, and changing the mounting angle of the ion source 38 enables adjustment of the incidence angles and positions of an ion beam colliding with substrates 14. Namely, adjusting the position of the ion source 38 in the height direction, the position thereof in the radial direction of the vacuum vessel 10, and the mounting angle of the ion source, causes the ion source to be adjusted so that loss of the ion beam is restricted to a minimal extent, and the ion current density is uniformly distributed over an applicable film formation region.

Here, the mounting angle $\theta$ of the ion source 38 (hereinafter simply called "mounting angle $\theta$") means a maximum angle to be defined between an axis, along which an ion beam is irradiated and a line perpendicular to a surface of each substrate 14 installed on the substrate holder 12. As described above, the substrate holder 12 is rotated, so that positions of substrates 14 are varied, and concurrently therewith, the angle to be defined between the line perpendicular to a surface of each substrate 14 and an ion beam is varied. However, the mounting angle $\theta$ is to be defined at the time where such an angle is brought to be maximum. It is noted that the mounting angle $\theta$ has the same meaning as an ion beam irradiating angle in the present specification.

It is assumed that excessively larger mounting angles $\theta$ lead to smaller angles to be defined between surfaces of substrates 14 and ion beams, and as a result, even when an ion beam collides with each substrate 14, the ion beam is rebounded by the substrate without exerting a due effect thereon, thereby deteriorating effects of ion assistance. Further, larger mounting angles $\theta$ rather cause the substrate holder 12 to obstruct ion beams, particularly when the substrate holder 12 to be adopted is curved, so that film-qualities of optical thin-films to be formed on substrates 14 are made inhomogeneous. Moreover, when the mounting angle $\theta$ is excessively large, an ion beam is obstructed by a part of the substrate holder 12 formed into a dome shape, thereby causing deteriorated ion assistance efficiencies.

In turn, when the mounting angle $\theta$ is small, the distance between the ion source 38 and substrates is caused to be increased, thereby disadvantageously decreasing the ion assistance effect. Namely, when the mounting angle $\theta$ is small, an ion beam is caused to collide with surfaces of substrates 14 at angles close to a right angle, in a manner to fail to provide a larger energy to a vapor deposition substance, thereby deteriorating the effect to densify the accumulated vapor deposition layers.

Thus, the mounting angle $\theta$ is between 6° inclusive and 70° inclusive, preferably between 8° inclusive and 40° inclusive as described hereinafter, thereby providing a vapor deposition apparatus capable of forming an optical thin-film having an excellent film-quality, because the ion beam is never obstructed by a part of each substrate 14 even in case of adopting the substrate 14 such as a lens having a concavity and/or convexity thereon.

Further, the above effect of the method of causing an ion beam to be incident on a surface of each substrate 14 from a direction oblique thereto has been recognized independently of a distance between the substrates 14 and the ion source 38, insofar as the distance is shorter than or equal to the mean free path. Namely, it is possible to obtain a higher effect of ion assistance by utilizing the method to cause an ion beam to be incident on a surface of each substrate 14 from a direction oblique thereto, insofar as within a range where the ion beam from the ion source 38 is capable of reaching the substrate 14. It is noted that the mounting angle θ can be of course appropriately varied depending on the size of the substrate holder 12 or vacuum vessel 10, or the type of film-forming material, insofar as within the above-mentioned angle range.

The mounting height h is set so that the distance between the ion source 38 and an applicable substrate 14 is made appropriate. Excessively higher mounting heights h lead to shorter distances between the ion source 38 and the applicable substrate 14, so that the ion source 38 is apt to be contaminated by a sputtered vapor deposition substance. In turn, excessively lower mounting heights h lead to longer distances between substrates 14 and the ion source 38, and lead to excessively smaller mounting angles θ. Thus, the mounting height h is required to be a position capable of obtaining an appropriate mounting angle θ.

Concerning the mounting position of the ion source 38, and assuming that: H represents a distance in a vertical direction between (i) an intersection between a center of rotational axis of the substrate holder 12 and the substrate holder itself, and (ii) a center of the ion source 38, i.e., H represents a height of the substrate holder from the ion source; and D represents a diameter of the substrate holder 12; the ratio of H relative to D, i.e., the value of H/D, is to be preferably 0.5 to 1.2. For example, the diameter D and distance H are set as shown in the following Table 1.

TABLE 1

| maximum incidence angle (deg.) | minimum incidence angle (deg.) | D (mm) | H (mm) | H/D |
|---|---|---|---|---|
| 16 | 14 | 720 | 870 | 1.2 |
| 35 | 27 | 1,200 | 600 | 0.5 |
| 19 | 14 | 1,390 | 1,080 | 0.8 |

It is desirable that the distance between the ion source 38 and an applicable substrate 14 is equal to or smaller than a mean free path l of ions to be irradiated from the ion source 38. For example, when the mean free path l=500 mm, the distance between the ion source 38 and the applicable substrate 14 is also to be desirably set at 500 mm or shorter. By setting the distance between the ion source 38 and the applicable substrate 14 at the mean free path l or shorter, more than half the ions emitted from the ion source 38 are allowed to be collided with the substrates 14 in a collisionless state of the ions. This allows an ion beam still having a higher energy to be irradiated onto the substrates 14, thereby enhancing an effect of ion assistance and enabling film formation with a lower electric-power or in a shorter time.

It is noted that the "distance between the ion source 38 and an applicable substrate 14" means a distance from a center of the ion source 38 to a center of the substrate holder 12 at a film-forming face side thereof. Similarly, the "distance between the vapor deposition source 34 and an applicable substrate 14" means a distance from the center of the vapor deposition source 34 to the center of the substrate holder 12 at the film-forming face side thereof.

The mounting position of the ion source 38 is not limited to that at the side surface of the vacuum vessel 10, and it may be arranged at a position separated from the sidewall surface of the vacuum vessel 10 by means of the attachment 44. Since the attachment 44 is capable of adjusting the position of the ion source 38 in the radial direction of the vacuum vessel 10 as well, it is possible to readily achieve an appropriate arrangement.

In this case, it is possible to irradiate an ion beam to substrates 14 from a position closer to them, thereby obtaining an excellent effect of ion assistance even with a lower energy (power consumption). Further, this embodiment can be utilized even in such a situation that film formation is conducted under a film-forming condition with a lower degree of vacuum in a large-sized vapor deposition apparatus. Furthermore, this embodiment can be preferably utilized even in a vapor deposition apparatus having a larger distance between the substrate holder 12 and an inner wall surface of the vacuum vessel 10. It is of course possible to install the ion source 38 at the vessel bottom portion. In this case, it is enough to install a pedestal on the bottom portion and to mount the ion source 38 thereon.

Further, since a more excellent effect of ion assistance is obtainable even by a lower ion current (power consumption) as described above, separation of a vapor deposition substance attached to surfaces of substrates 14, the substrate holder 12, and the like due to collision of an ion beam therewith, was decreased. Namely, it is possible to decrease an amount of foreign matters brought to be present within the vacuum vessel 10, thereby enabling a film formation to be conducted with a higher precision. In other words, it is possible to produce an optical filter with a higher precision, while decreasing production cost by virtue of the improved yield of the film-forming step.

Moreover, since the ion source 38 is mounted at the side surface of the vacuum vessel 10, it avoids hindrance of an ion beam by a film-thickness correcting plate (not shown) to be arranged between the vapor deposition source 34 and substrates 14, thereby decreasing the loss of ions and achieving more efficient film formation. It is noted that, since the effect of ion assistance is gradually improved as the incidence angle of the ion beam relative to each substrate 14 is increased, increasing the mounting angle θ exemplarily decreases power consumption and prolongs the lifetime of the ion gun. Details thereof will be explained based on Examples to be described below.

Next, the mounting position of the neutralizer 40 will be explained. It is enough for the mounting position of the neutralizer 40 that the neutralizer 40 be capable of irradiating electrons to substrates 14 to thereby neutralize them, as described above. Nonetheless, by disposing the neutralizer 40 at a position closer to the substrate holder 12, it becomes possible to accurately irradiate electrons toward those regions of substrates 14 onto which the ions irradiated from the ion source 38 are attached.

Further, when the neutralizer 40 is arranged at a position separated from the ion source 38 by a predetermined distance, electrons are not likely to directly react with ions moving from the ion source 38 toward substrates 14, thereby neutralizing electric charges on the substrates 14 with good efficiency. This enables neutralizing of the substrates 14 even with a lower value of electric current to be applied to the neutralizer 40 as compared to the conventional optical thin-film vapor deposition apparatus. In turn, this enables the supply of sufficient electrons to surfaces of the substrates 14 upon exemplary formation of a high refractive index film, a low refractive index film, and the like thereon, in a manner that electrostatic repulsive forces are not likely to act on oxygen ions on the substrates 14, thereby causing the oxygen ions to readily fly toward the substrates 14. This resultingly enables a dielectric film, such as a high refractive index film, low refractive index film, or the like, to by perfectly oxidized.

It is noted that although the distance between the neutralizer 40 and the ion source 38 is to be preferably about 200 mm, it is appropriately varied depending on a desired film-forming condition. In such a case, the distance between the neutralizer 40 and the ion source 38 can be appropriately varied by adjusting the attachment 44 supporting the ion source 38.

Although the optical thin-film vapor deposition apparatus 1 according to this embodiment is constituted of one ion source 38 and one neutralizer 40, the apparatus may be constituted such that these components are provided in multiples, respectively. For example, it is possible for the ion source 38 and neutralizer 40 to comprise multiple ion sources and multiple neutralizers provided along a rotating direction of the rotating substrate holder 12, respectively. Adopting such a construction enables the present invention to be more effectively applied to a large-sized vapor deposition apparatus having a substrate holder 12 in a larger size.

The operation of the optical thin-film vapor deposition apparatus 1 will be explained hereinafter. Substrates 14 are set on the substrate holder 12 within the vacuum vessel 10, and the interior of the vacuum vessel 10 is evacuated down to a predetermined pressure. Further, the substrate holder 12 is rotated at a predetermined revolution number, and the substrates 14 are brought to a predetermined temperature by a heater (not shown). Then, the ion source 38 is brought into an idling state capable of immediately irradiating ions therefrom, and the vapor deposition source 34 is brought into a state capable of immediately emitting vaporized particles by means of an opening operation of the shutter 34a. Further, the procedure is progressed to a vapor deposition step, after the revolution number of the substrate holder 12 and the temperatures of the substrates 14 have reached the predetermined conditions, respectively.

The vapor deposition step is configured to control opening and closing of the shutter of the vapor deposition source 34 for emitting a high refractive index substance ($Ta_2O_5$ or $TiO_2$, for example) and a low refractive index substance ($SiO_2$, for example), thereby alternately emitting the high refractive index substance and low refractive index substance toward the substrates 14. During emission of these vaporized substances, ions ($O_2^+$, $Ar^+$, or the like) emitted by opening the shutter 38a of the ion source 38 are collided with the substrates 14, thereby smoothing the surfaces of the vapor deposition substances attached to the substrates 14 and densifying the substances. This operation is repeated a predetermined number of times, thereby forming a multi-layer film on each substrate. Although the irradiation of the ion beam causes a deviation of electric charges of the substrates 14, this deviation of electric charges is neutralized by irradiating electrons from the neutralizer 40 toward the substrates 14.

Here, the effects of mounting of the ion source 38 on the side surface of the vacuum vessel 10 are considered. As a first effect, an ion beam is irradiated in a state of higher energy to substrates 14, because the distance between the ion source 38 and the substrates 14 is shorter than that in the conventional optical thin-film vapor deposition apparatus. As such, film formation can be achieved with a lower electric-power or in a shorter time, thereby improving the film-qualities. As a second effect, since the ion beam is incident on the substrates 14 at predetermined angles, respectively, more stress in a shearing direction may be exerted to a surface of each substrate 14 than in a case where an ion beam is collided with a substrate 14 at an angle close to a right angle. Namely, the energy provided to the vapor deposition substance is large, and the migration of the vapor deposition substance accumulated on the surface of each substrate 14 is high, so that film formation can be achieved with a lower electric-power or in a shorter time, thereby enabling improvement of film-quality.

The improvement of film-quality implies that cleaning and smoothing of a thin-film accumulated on each substrate 14 are achieved or densification of a thin-film structure is achieved, and such an effect is exhibited by the fact that molecules (vapor deposited molecules) constituting a vapor deposition layer accumulated on a surface of each substrate 14 are migrated to stable positions on the substrate 14 and to stand still there, respectively. At this time, the irradiated ion beam (ions) is (are) collided with the vapor deposited molecules to promote migration thereof, so that the thin-film is densified and the compositional homogeneity thereof is improved, thereby achieving a reduction of stress distortion of the thin-film structure. In this way, the film-formed structure is caused to have a higher homogeneity, thereby obtaining a stable optical filter which varies less in refractive index and which has an optical-absorption coefficient equal to or smaller than a certain value.

In this embodiment, it is possible to obtain a higher ion assistance when the mounting angle θ is within an angle range between 8° inclusive and 40° inclusive, thereby exemplarily reducing power consumption and obtaining a thin-film having an excellent film-quality. Details thereof will be explained based on Examples to be described later.

Example 1

Figure 2:
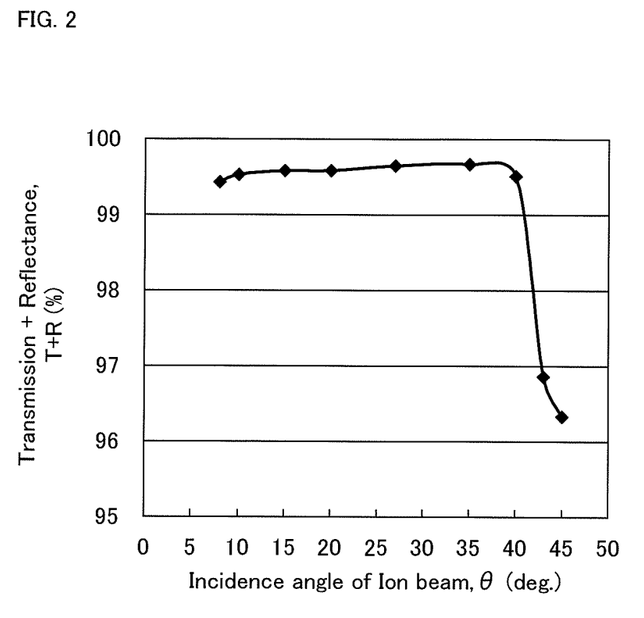
FIG. 2 is a graph of a relationship between an ion-beam incidence angle θ and a sum of a transmission and a reflectance of an optical thin-film.

The result of conducting film formation by using the optical thin-film vapor deposition apparatus 1 shown in FIG. 1 will be explained with reference to FIG. 2. FIG. 2 is a graph of the relationship between mounting angle (ion-beam incidence angle) θ and a sum of a transmission and a reflectance of an optical thin-film, and shows a sum of transmission T+reflectance R (average values at a wavelength λ=450 to 550 nm). The measured mounting angles θ were within a range of 8 to 45°. The mounting angle θ was varied by adjusting the mounting position of the ion source 38, and the attachment 44 itself.

It is noted that FIG. 2 shows a situation where the energy density of the ion beam upon film formation was 50 mW/cm². All the optical thin-films evaluated in FIG. 2 were each an optical thin-film comprising alternately film-formed high refractive index substance and low refractive index substance as vapor deposition substances, respectively. It is noted that the optical thin-films were each comprised of a multi-layer film for a short wavelength pass filter (SWPF) comprising 36 layers adopting $Ta_2O_5$ as the high refractive index substance and $SiO_2$ as the low refractive index substance.

The film-forming condition of each optical thin-film in FIG. 2 was as follows. It is noted that the Ta—O bond and the Si—O bond are different from each other in bond energy, and Si and Ta are different from each other in atomic weight, so that $Ta_2O_5$ and $SiO_2$ were film-formed under the different film-forming conditions as follows.

Substrate: BK7 (refractive index n=1.52)
Film material: $Ta_2O_5$ (high refractive index film), $SiO_2$ (low refractive index film)
Film formation speed of $Ta_2O_5$: 1.1 nm/sec
Film formation speed of $SiO_2$: 1.5 nm/sec
Ion source condition upon vaporization of $Ta_2O_5/SiO_2$:
Introduced gas: oxygen, 60 sccm
Ion acceleration voltage: 800V
Ion current: 850 mA
Ion beam energy density: 50 mW/cm²
Mounting angle θ: 8 to 45°

Condition of neutralizer:
Electric current of neutralizer: 1,000 mA
Discharge gas: Argon, 10 sccm According to FIG. 2, the multi-layer films fabricated within the range of the mounting angle θ=8 to 40°, stably exhibit larger values of the sum of transmission T+reflectance R. Mutually comparing the multi-layer films shown in FIG. 2 in terms of specific values of sums of transmission T+reflectance R, the sum value was 96.9% at a mounting angle θ=43° whereas the sum values were 99.4% at a mounting angle θ=8° and 99.5% at a mounting angle θ=40°, respectively, thereby making it clear also from FIG. 2 that values of sums of transmission T+reflectance R were small in a range where the mounting angle θ was larger than 40°. As seen from FIG. 2, the range, where the value of sum of transmission T+reflectance R exceeds 99%, is restricted to the mounting angle θ=8 to 40°, so that achievement of this range of mounting angle θ enables improvement of the ion assistance effect and formation of a multi-layer film having excellent optical characteristics.

Example 2

Figure 3:
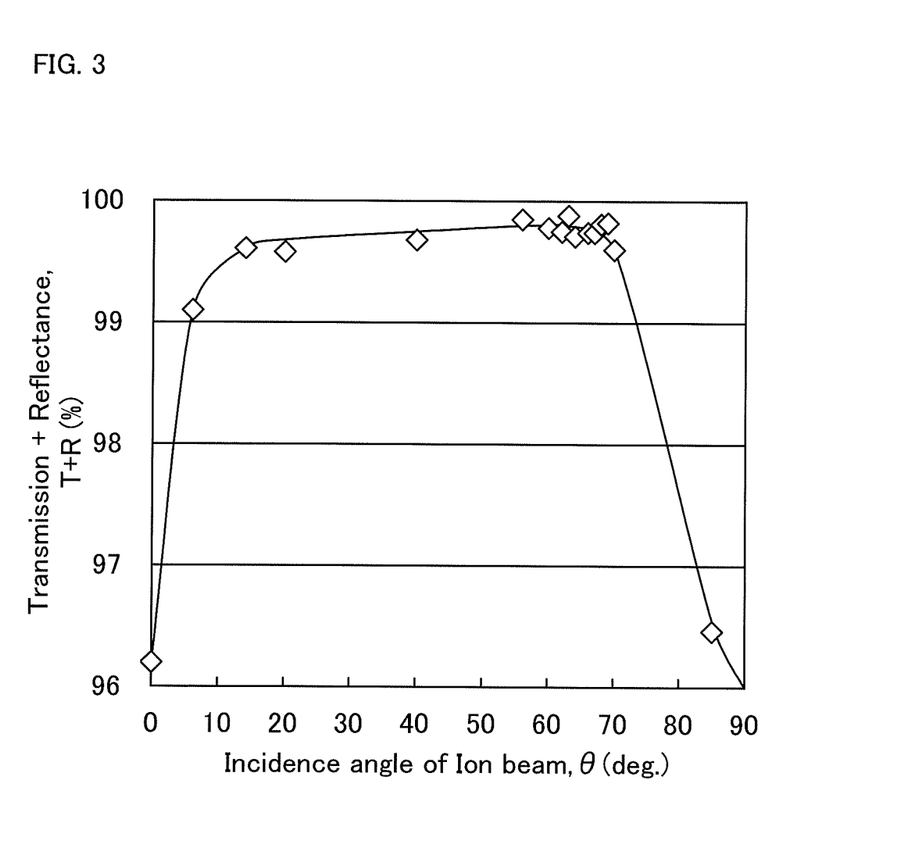
FIG. 3 is a graph of another relationship between an ion-beam incidence angle θ and a sum of a transmission and a reflectance of an optical thin-film.

Next, the result of conducting film formation by using the optical thin-film vapor deposition apparatus 1 shown in FIG. 1 will be explained with reference to FIG. 3. FIG. 3 is a graph of another relationship between mounting angle (ion-beam incidence angle) θ and a sum of a transmission and a reflectance of an optical thin-film, and shows a sum of transmission T+reflectance R at a wavelength λ=550 nm. The measured mounting angles θ were within a range of 0 to 85°. The mounting angle θ was varied by adjusting the mounting position of the ion source 38, and the attachment 44 itself.

Whereas Example 1 was conducted by setting the energy density of the ion beam at 50 mW/cm$^2$ as noted above, film formation was conducted in Example 2 by setting the energy density of ion beam as follows and the mounting angle θ at 0 to 85°. The mounting angle θ was varied by adjusting the mounting position of the ion source 38, and the attachment 44 itself. Further, whereas the film of Example 1 comprised 36 layers, Example 2 was a multi-layer film of an infrared cut filter comprising 27 layers adopting $TiO_2$ as the high refractive index substance and $SiO_2$ as the low refractive index substance.

The film-forming condition in Example 2 was as follows.
Substrate: BK7 (refractive index n=1.52)
Film material: $TiO_2$ (high refractive index film), $SiO_2$ (low refractive index film)
Ion source condition upon vaporization of $TiO_2/SiO_2$:
Introduced gas: oxygen, 60 sccm
Ion acceleration voltage: 200 to 1,200V
Ion current: 200 to 1,000 mA
Ion beam energy density: 5 to 150 mW/cm$^2$
Mounting angle θ: 0 to 85°, totally 16 conditions
Condition of neutralizer:
Electric current of neutralizer: 1,000 mA
Discharge gas: Argon, 10 sccm It is noted that the film formation speed of $TiO_2/SiO_2$ is a value to be varied depending on a value of the mounting angle θ. As such, the ion acceleration voltage and ion current were appropriately varied within the above conditional range, commensurately with the value of mounting angle θ so as to keep the film formation speed of $TiO_2/SiO_2$ constant.

In this way, the effect of improving the sum value of transmission T+reflectance R was recognized within the range of 6 to 70° for the mounting angle in the above film-forming condition. Namely, causing the ion beam to be incident on each substrate 14 at a predetermined angle therebetween allowed for obtainment of an optical filter, which had an optical-absorption coefficient equal to or smaller than a certain value, and which had an excellent film-quality.

Further, even in a case that the ion source 38 was disposed at the bottom side of the vacuum vessel 10, thin-films excellent in film-quality were obtained under the above-described film-forming condition, insofar as within the range of mounting angle θ=6 to 70°. Thus, it was found that thin-films having excellent film-qualities were obtained by the method of causing the ion beam to be incident on each substrate 14 at a predetermined angle therebetween, irrespectively of the distance between the ion source 38 and the substrate 14.

It is noted that the effect of ion assistance was recognized to be gradually improved as the mounting angle θ was increased. Namely, since such a phenomenon was recognized that an optimum ion acceleration voltage and an optimum ion current were gradually lowered as the mounting angle θ was increased, it is possible to exemplarily decrease power consumption and achieve a longer lifetime of the ion gun in addition to improvement of film-quality, by largely setting the mounting angle θ. Thus, from the measurement results of above-described Example 1 and Example 2, it has been shown that the mounting angle θ is to be preferably 6 to 70° at least at a wavelength λ=550 nm, and that the sum value of transmission T+reflectance R is further preferably increased within a wavelength range of 450 nm to 550 nm when the mounting angle θ=8 to 40°.

Further conducted for the obtained optical thin-films was a pure water boiling test, thereby revealing that, whereas a wavelength shift was observed in optical thin-films obtained when the mounting angle θ=45° or more, no wavelength shifts were observed in the optical thin-films obtained when the mounting angle θ=8 to 40°. This implies that, where the optical thin-films obtained when the mounting angle θ=45° or more are used in an ordinary environment, the initial optical characteristics of the optical thin-films are changed due to their absorption of moisture in the atmospheric air.

It was thus revealed that the above-mentioned wavelength shift can be effectively restricted (or avoided) by virtue of ion assistance when the mounting angle θ=8 to 40°. Further, it was clarified that, by setting the mounting angle θ within the above range particularly restricts a wavelength shift, remarkably better ion assistance was exhibited.

Example 3

Comparative Example 1

Figure 4:
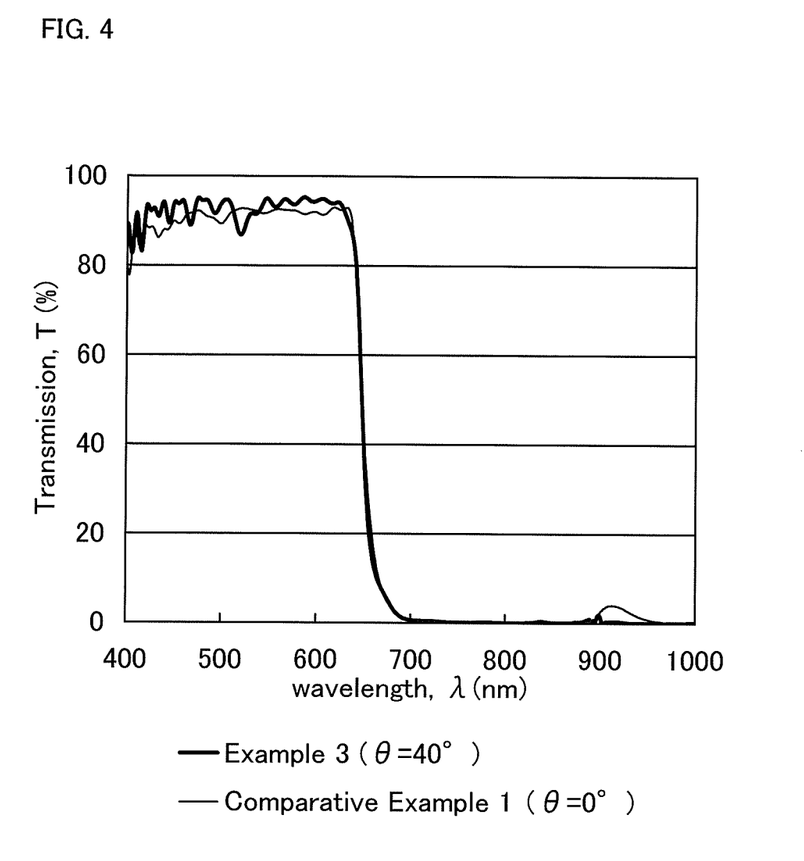
FIG. 4 is a graph of transmissions of optical thin-films of Example 3 and Comparative Example 1.
Figure 5:
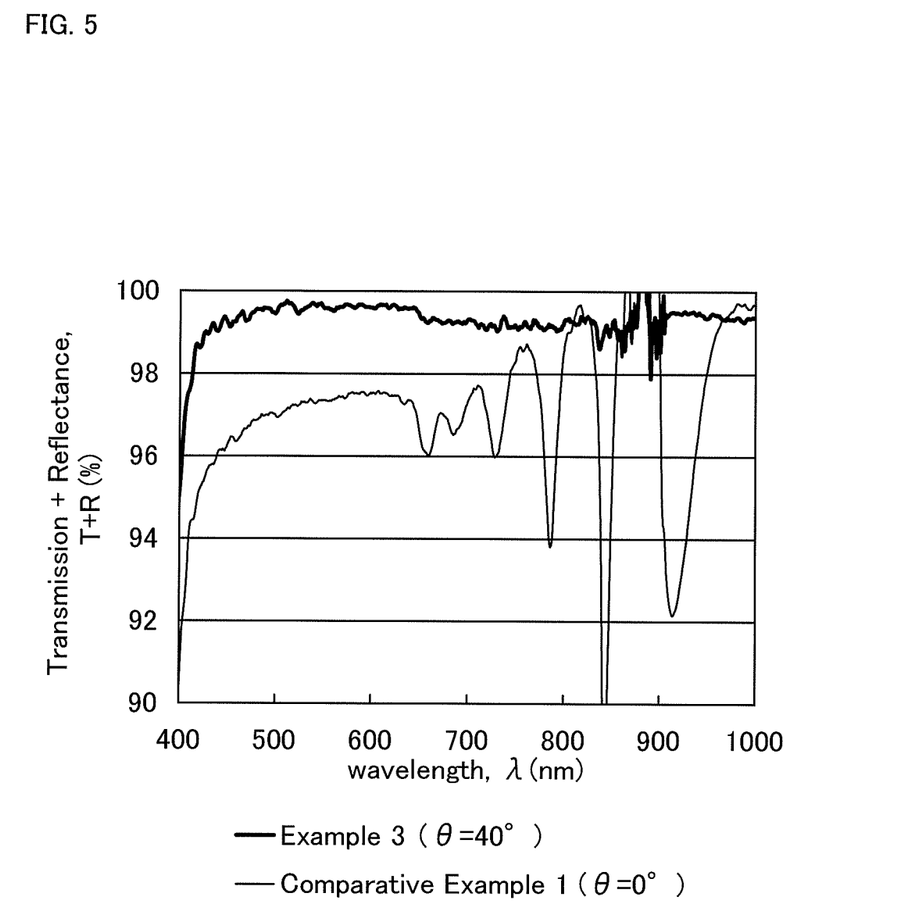
FIG. 5 is a graph of sums of a transmission and a reflectance of the optical thin-films of Example 3 and Comparative Example 1.

Example 1 (mounting angle θ=40°), where the film formation was conducted by using the optical thin-film vapor deposition apparatus 1 shown in FIG. 1, will be explained by comparing it with Comparative Example 1 (mounting angle θ=0°), where film formation was conducted by using the conventional optical thin-film vapor deposition apparatus (see FIG. 7). It is noted that the mounting angle θ=0° corresponds to a situation where the ion source 38 is positionally coincident with a center of curvature of the substrate holder 12. In each of Example 1 and Comparative Example 1, the high refractive index substance and low refractive index substance as the vapor deposition substances were alternately film-formed. It is noted that, formed in each of Example 1 and Comparative Example 1, was a multi-layer film for a short wavelength pass filter (SWPF), comprising 36 layers adopting $Ta_2O_5$ as the high refractive index substance and $SiO_2$ as the low refractive index substance. Further, measurement results concerning optical characteristics of the fabricated SWPF multi-layer films are shown in FIG. 4 and FIG. 5.

The film-forming condition of Example 3 was as follows. It is noted that the Ta—O bond and the Si—O bond are different from each other in bond energy, and Si and Ta are different from each other in atomic weight, so that $Ta_2O_5$ and $SiO_2$ were film-formed under the different film-forming conditions as follows.

Substrate: BK7 (refractive index n=1.52)
Film material: $Ta_2O_5$ (high refractive index film), $SiO_2$ (low refractive index film)
Film formation speed of $Ta_2O_5$: 0.5 nm/sec
Film formation speed of $SiO_2$: 1.0 nm/sec
Ion source condition upon vaporization of $Ta_2O_5$:
Introduced gas: oxygen, 60 sccm, and argon, 7 sccm
Ion acceleration voltage: 500V
Ion current: 500 mA
Mounting angle θ: 40°
Ion source condition upon vaporization of $SiO_2$:
Introduced gas: oxygen, 50 sccm
Ion acceleration voltage: 500V
Ion current: 500 mA
Mounting angle θ: 40°
Condition of neutralizer:
Electric current of neutralizer: 1,000 mA
Discharge gas: Argon, 10 sccm The film-forming condition of Comparative Example 1 was as follows. It is noted that the Ta—O bond and the Si—O bond are different from each other in bond energy, and Si and Ta are different from each other in atomic weight, so that $Ta_2O_5$ and $SiO_2$ were film-formed under the different film-forming conditions as follows.

Substrate: BK7 (refractive index n=1.52)
Film material: $Ta_2O_5$ (high refractive index film), $SiO_2$ (low refractive index film)
Film formation speed of $Ta_2O_5$: 0.5 nm/sec
Film formation speed of $SiO_2$: 1.0 nm/sec
Ion source condition upon vaporization of $Ta_2O_5$:
Introduced gas: oxygen, 60 sccm, and argon, 7 sccm
Ion acceleration voltage: 500V
Ion current: 500 mA
Mounting angle θ: 0°
Ion source condition upon vaporization of $SiO_2$:
Introduced gas: oxygen, 50 sccm
Ion acceleration voltage: 500V
Ion current: 500 mA
Mounting angle θ: 0°
Condition of neutralizer:
Electric current of neutralizer: 1,000 mA
Discharge gas: Argon, 10 sccm Here will be explained an ion arrival probability in a collisionless state in the conventional optical thin-film vapor deposition apparatus used in Comparative Example 1 and in the optical thin-film vapor deposition apparatus 1 used in Example 3. Assuming that the vacuum condition in both Example 3 and Comparative Example 1 is provided by an $O_2$ gas ambient at 250° C. and $2.5 \times 10^{-2}$ Pa, the mean free path l is to be 500 mm in both cases. Since the distance (distance d) from the ion source 38 to the center of the substrate holder 12 is 1.012 mm in the conventional optical thin-film vapor deposition apparatus whereas the distance d is 439 mm in the optical thin-film vapor deposition apparatus 1, the ion arrival probability in a collisionless manner in the conventional optical thin-film vapor deposition apparatus is 13% whereas the same is 41% in the optical thin-film vapor deposition apparatus 1.

Namely, comparing the optical thin-film vapor deposition apparatus 1 with the conventional optical thin-film vapor deposition apparatus while assuming that the condition for the ion source 38 is the same, approximately three times as many ions still in a state without collision with gas molecules are caused to reach substrates 14 in the apparatus 1 than the conventional apparatus. Thus, ions to be irradiated to substrates 14 in the optical thin-film vapor deposition apparatus 1 are caused to have larger kinetic energies than those in the conventional optical thin-film vapor deposition apparatus.

FIG. 4 is a graph showing a spectroscopic transmission characteristic (transmission) of each of the optical filters of Example 3 and Comparative Example 1, and the graph was obtained by irradiating light having a wavelength λ over a range of 400 to 1,000 nm to each fabricated SWPF multi-layer film and by plotting a transmission T in relation to the wavelength λ. According to FIG. 4, the multi-layer film fabricated in Example 3 exhibits a higher value for transmission T as compared with the multi-layer film of Comparative Example 1 where the wavelength λ is within a range of 400 to 550 nm, though except for partial wavelength ranges.

Specifically, and mutually comparing transmissions T at the wavelength λ=480 nm, the transmission T of the multi-layer film in Comparative Example 1 was 91.5%, and the transmission T of the multi-layer film in Example 3 was 94.5%. Further, comparing transmissions T at the wavelength λ=550 nm, the transmission T of the multi-layer film in Comparative Example 1 was 92.1%, and the transmission T of the multi-layer film in Example 3 was 94.3%.

It was thus revealed that the multi-layer film formed at the mounting angle θ=40° in Example 3 had a higher transmission T than the multi-layer film formed at the mounting angle θ=0° in Comparative Example 1.

FIG. 5 is a graph showing a sum of a transmission T and a reflectance R of each of the optical filters of Example 3 and Comparative Example 1, and the graph was obtained by irradiating light having a wavelength λ, over a range of 400 to 1,000 nm to each fabricated multi-layer film and by plotting a sum value (transmission T+reflectance R) of the transmission T and reflectance R at the wavelength λ in relation thereto.

According to FIG. 5, the multi-layer film fabricated in Example 3 exhibits a higher value for a sum of transmission T+reflectance R as compared with the multi-layer film of Comparative Example 1 where the wavelength λ is within a range of 400 to 800 nm. Further, the multi-layer film fabricated in Example 3 exhibits a relatively flat transition for the sum of transmission T+reflectance R, as compared with the multi-layer film in Comparative Example 1. For example, although a recession of the sum of transmission T+reflectance R is found at the wavelength λ near 680 nm in case of the multi-layer film fabricated in Comparative Example 1, such a recession is never found anywhere in case of the multi-layer film fabricated in Example 3.

Mutually comparing sums of transmission T+reflectance R at the wavelength λ=480 nm, the sum of transmission T+reflectance R of the multi-layer film in Comparative Example 1 was 96.9%, and the sum of transmission T+reflectance R of the multi-layer film in Example 3 was 99.6%. Further, mutually comparing sums of transmission T+reflectance R at the wavelength λ=550 nm, the sum of transmission T+reflectance R of the multi-layer film in Comparative Example 1 was 97.4%, and the sum of transmission T+reflectance R of the multi-layer film in Example 3 was 99.6%. Moreover, although the sum value of transmission T+reflectance R of the multi-layer film in Example 3 is relatively flat (constant) within a wavelength range of 400 to 1,000 nm, the sum value of transmission T+reflectance R of the multi-layer film in Comparative Example 1 is more considerably fluctuated in the longer wavelength range.

It was thus revealed that the multi-layer film formed at the mounting angle θ=40° in Example 3 had a higher sum value of transmission T+reflectance R than the multi-layer film formed at the mounting angle θ=0° in Comparative Example 1, and that the multi-layer film of Example 3 keeps a stable optical characteristic over a wider wavelength range.

In this way, as compared to the multi-layer film (Comparative Example 1) fabricated by the conventional apparatus, the multi-layer film (Example 3) fabricated by the optical thin-film vapor deposition apparatus 1 has been improved in transmission T and remarkably improved in sum value of transmission T+reflectance R, within a range of 400 to 550 nm for the wavelength λ. Further, Example 3 exhibits a relatively flat sum of transmission T+reflectance R over a wider wavelength range. Namely, the above-mentioned optical thin-film of Example 3 can be regarded as a multi-layer film, which varies less in refractive index, which has a stable characteristic in a manner to have an optical-absorption coefficient equal to or smaller than a certain value, and which thus has excellent optical characteristics.

Examples 4 and 5

Figure 6:
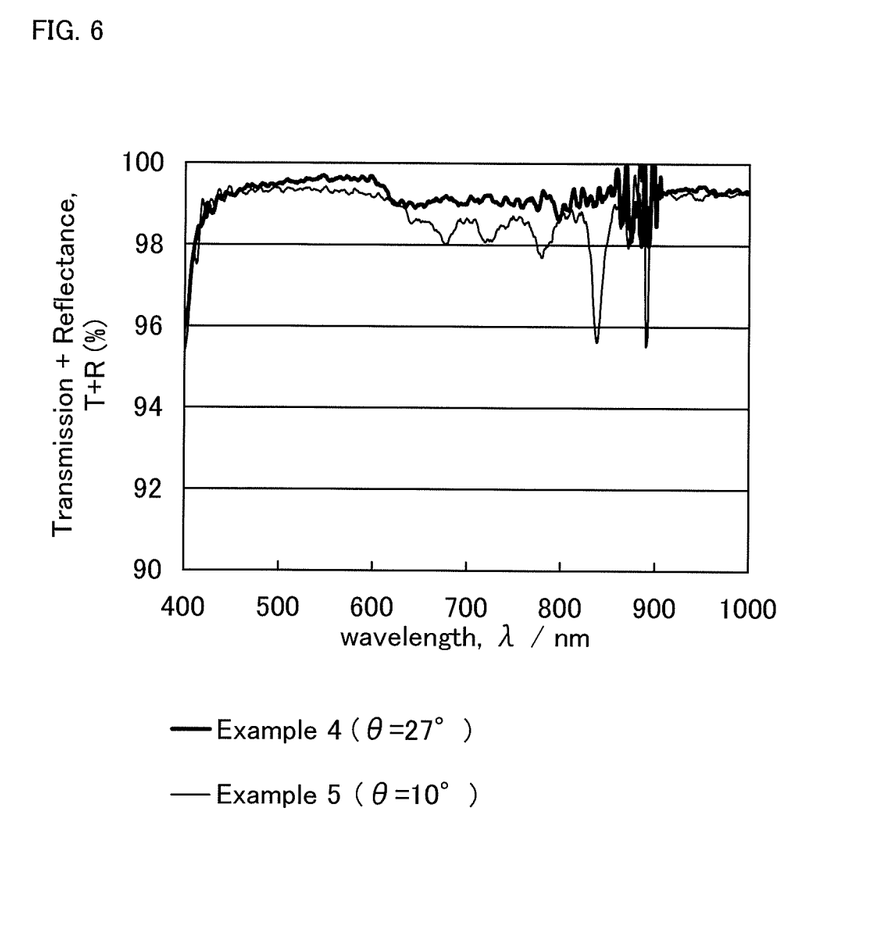
FIG. 6 is a graph of sums of a transmission and a reflectance of the optical thin-films of Examples 4 and 5.

FIG. 6 is a graph showing a sum of a transmission T and a reflectance R of each of the optical thin-films of Examples 4 and 5, and the graph was obtained by irradiating light having a wavelength λ over a range of 400 to 1,000 nm to each fabricated multi-layer film and by plotting a sum value (transmission T+reflectance R) of the transmission T and reflectance R at the wavelength λ in relation thereto. In each of Examples 4 and 5, the high refractive index substance and low refractive index substance as the vapor deposition substances were alternately film-formed. It is noted that, formed in Examples 4 and 5, was a multi-layer film for a short wavelength pass filter (SWPF), comprising 36 layers adopting $Ta_2O_5$ as the high refractive index substance and $SiO_2$ as the low refractive index substance. Further, measurement results concerning optical characteristics of the fabricated SWPF multi-layer films are shown in FIG. 6.

The film-forming condition of Examples 4 and 5 was as follows. It is noted that the Ta—O bond and the Si—O bond are different from each other in bond energy, and Si and Ta are different from each other in atomic weight, so that $Ta_2O_5$ and $SiO_2$ were film-formed under the different film-forming conditions as follows.

Substrate: BK7 (refractive index n=1.52)
Film material: $Ta_2O_5$ (high refractive index film), $SiO_2$ (low refractive index film)
Film formation speed of $Ta_2O_5$: 0.5 nm/sec
Film formation speed of $SiO_2$: 1.0 nm/sec
Ion source condition upon vaporization of $Ta_2O_5$:
Introduced gas: oxygen, 60 sccm, and argon, 7 sccm
Ion acceleration voltage: 500V
Ion current: 500 mA
Mounting angle θ: 45°
Ion source condition upon vaporization of $SiO_2$:
Introduced gas: oxygen, 50 sccm
Ion acceleration voltage: 500V
Ion current: 500 mA
Mounting angle θ: 40°
Condition of neutralizer:
Electric current of neutralizer: 1,000 mA
Discharge gas: Argon, 10 sccm FIG. 6 shows measurement results of multi-layer films formed under dual conditions of 27° (Example 4) and 10° (Example 5) for the mounting angle θ. It was revealed in each case that the sum value of transmission T+reflectance R was larger than 99% within a range of wavelength λ=400 to 600 nm, so that the multi-layer film was excellent in optical characteristic.

In this way, those multi-layer films, which were formed where the mounting angle θ was set within a range of 8 to 40° (6 to 70° in case of optical thin-films intended for a particular film-forming condition and a particular usage environment), have larger and approximately constant sum values of transmission T+reflectance R, particularly within a range of wavelength λ=400 to 600 nm. Namely, causing the ion beam to be incident on each substrate 14 at a predetermined angle therebetween allowed for obtainment of an optical filter, which had an optical-absorption coefficient equal to or smaller than a certain value, and which had an excellent film-quality.

Further, even in a case that the ion source 38 was disposed at the bottom side of the vacuum vessel 10, thin-films having excellent film-qualities were obtained within a range of mounting angle θ=8 to 40° (6 to 70° in case of optical thin-films intended for a particular film-forming condition and a particular usage environment), without changing the optical characteristics of the thin-films due to moisture in the atmospheric air. Thus, by setting the distance between the ion source 38 and an applicable substrate 14 to be equal to or smaller than the mean free path l, and by causing the ion beam to be incident on each substrate 14 at a predetermined angle therebetween, a thin-film having an excellent film-quality is obtained, irrespectively of the distance between the ion source 38 and the applicable substrate 14.

It is noted that the effect of ion assistance was recognized to be gradually improved as the mounting angle θ was increased, at this time. Namely, since it was recognized that an optimum ion acceleration voltage and an optimum ion current were gradually lowered as the mounting angle θ was increased, it is possible to exemplarily decrease power consumption and achieve a longer lifetime of the ion source 38 in addition to improvement of film-quality, by largely setting the mounting angle θ.

The invention claimed is:

1. An optical thin-film vapor deposition apparatus for vapor depositing a vapor deposition substance onto substrates within a vacuum vessel, comprising:

a dome shaped holder disposed within the vacuum vessel and configured to hold the substrates;

rotating means configured to rotate the dome shaped holder;

a vapor deposition source disposed oppositely to the substrates for vaporizing the vapor deposition substance to form a source gas and emitting the substance toward the substrates;

an ion source configured to extract ions from a plasma of the source gas of the ions in the vacuum vessel and irradiate an ion beam of the ions to the substrates; and a neutralizer configured to irradiate electrons to the substrates;

wherein the ion source is disposed at a position such that a maximum angle defined between an axis for each direction, along which ions travel from the ion source to each of the substrates, and a line perpendicular to a surface of each of the corresponding substrates held by the dome shaped holder, is between 8° inclusive and 40° inclusive; and H/D is within a range between 0.5 inclusive and 1.2 inclusive; wherein H/D is a ratio of a distance, H, in a vertical direction between (i) an intersection between a center of rotational axis of the dome shaped holder and the dome shaped holder itself, and (ii) a center of the ion source; relative to a diameter, D, of the dome shaped holder.

2. The optical thin-film vapor deposition apparatus according to claim 1, wherein the ion source is disposed on a side surface of the vacuum vessel.

3. The optical thin-film vapor deposition apparatus according to claim 1, wherein the ion source is disposed so that a distance between the ion source and an applicable one of the substrates is equal to or shorter than a mean free path of ions to be irradiated from the ion source, resulting in that most of the ions emitted from the ion source are allowed to arrive at the substrates in a collisionless state.

4. The optical thin-film vapor deposition apparatus according to claim 1, wherein the ion source comprises:
   an ion source body that irradiates the ions;
   a connecting portion that connects the ion source body to the vacuum vessel; and
   a vacuum-inward introducing portion that introduces at least a source gas of the ions into the vacuum vessel; and
   wherein the angle, at which the ions are irradiated, relative to the line perpendicular to the surface of each of the substrates, is adjustable by modifying the connecting portion.

5. The optical thin-film vapor deposition apparatus according to claim 4, wherein the connecting portion includes a bracket fixed to the vacuum vessel side, and a locking member that fixes the inclination of the ion source at a predetermined angle.

6. The optical thin-film vapor deposition apparatus according to claim 1, wherein the neutralizer is disposed at a position separated from the ion source by a predetermined distance.

7. The optical thin-film vapor deposition apparatus according to claim 1, wherein the ion source comprises multiple ion sources provided along a rotating direction of the dome shaped holder.

8. An optical thin-film production method comprising the step of using the optical thin-film vapor deposition apparatus according to claim 1.

9. An optical thin-film production method comprising the step of using the optical thin-film vapor deposition apparatus according to claim 2.

10. An optical thin-film production method comprising the step of using the optical thin-film vapor deposition apparatus according to claim 3.

11. An optical thin-film production method comprising the stop of using the optical thin-film vapor deposition apparatus according to claim 4.

12. An optical thin-film production method comprising the step of using the optical thin-film vapor deposition apparatus according to claim 5.

13. An optical thin-film production method comprising the step of using the optical thin-film vapor deposition apparatus according to claim 6.

14. An optical thin-film production method comprising the step of using the optical thin-film vapor deposition apparatus according to claim 7.

* * * * *